(12) United States Patent
Cheng et al.

(10) Patent No.: US 10,805,565 B2
(45) Date of Patent: Oct. 13, 2020

(54) CMOS IMAGE SENSOR, PIXEL CIRCUIT AND DRIVING METHOD THEREOF

(71) Applicant: BOE Technology Group Co., Ltd., Beijing (CN)

(72) Inventors: Chih Jen Cheng, Beijing (CN); Xiaoliang Ding, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 155 days.

(21) Appl. No.: 16/078,626

(22) PCT Filed: Oct. 20, 2017

(86) PCT No.: PCT/CN2017/107105
§ 371 (c)(1),
(2) Date: Aug. 21, 2018

(87) PCT Pub. No.: WO2018/196301
PCT Pub. Date: Nov. 1, 2018

(65) Prior Publication Data
US 2019/0313048 A1 Oct. 10, 2019

(30) Foreign Application Priority Data

Apr. 27, 2017 (CN) .......................... 2017 1 0290607

(51) Int. Cl.
*H04N 5/3745* (2011.01)
*H04N 5/225* (2006.01)
(Continued)

(52) U.S. Cl.
CPC ... *H04N 5/37455* (2013.01); *H01L 27/14609* (2013.01); *H04N 5/2254* (2013.01);
(Continued)

(58) Field of Classification Search
CPC .. H04N 5/37455; H04N 5/3745; H04N 5/378; H04N 5/374; H04N 5/376; H04N 5/2254; H01L 27/14609
See application file for complete search history.

(56) References Cited

U.S. PATENT DOCUMENTS 8,189,082 B2   5/2012   Matsuura
8,456,558 B2   6/2013   Nishihara
(Continued)

FOREIGN PATENT DOCUMENTS

CN   101662572 A   3/2010
CN   101964878 A   2/2011
(Continued)

OTHER PUBLICATIONS

International Search Report and Written Opinion issued in corresponding International Patent Application No. PCT/CN2017/107105, dated Jan. 24, 2018.

*Primary Examiner* — Lin Ye
*Assistant Examiner* — John H Morehead, III
(74) *Attorney, Agent, or Firm* — McDermott Will & Emery LLP (57) ABSTRACT

Embodiments of the present disclosure provide a CMOS image sensor, and a pixel circuit and a driving method thereof. The pixel circuit includes: a collection circuit configure to collect an incident light and convert a collected optical signal into an electric signal; a source follower circuit configured to output the received electric signal to a collection signal output terminal under the control of scan lines; and a voltage conversion circuit, configured to be connected to the collection signal output terminal through a read signal line, convert a voltage at the collection signal output terminal to an output voltage, and output the output voltage at a voltage output terminal, wherein the output (Continued)

voltage is within an operating voltage range of an image processor.

15 Claims, 6 Drawing Sheets

(51) Int. Cl.
    *H04N 5/376*           (2011.01)
    *H04N 5/374*           (2011.01)
    *H04N 5/378*           (2011.01)
    *H01L 27/146*         (2006.01)

(52) U.S. Cl.
    CPC ............. *H04N 5/374* (2013.01); *H04N 5/376* (2013.01); *H04N 5/378* (2013.01); *H04N 5/3745* (2013.01)

(56) References Cited

U.S. PATENT DOCUMENTS

| | | | |
|---|---|---|---|
| 9,667,898 B2 | 5/2017 | Vogelsang et al. | |
| 2002/0039453 A1* | 4/2002 | Naiki | H04N 1/4072 |
| | | | 382/274 |
| 2003/0146993 A1* | 8/2003 | Kokubun | H04N 5/363 |
| | | | 348/308 |
| 2004/0104909 A1* | 6/2004 | Kawasaki | G09G 3/3283 |
| | | | 345/212 |
| 2008/0151091 A1* | 6/2008 | Hynecek | H01L 27/14603 |
| | | | 348/308 |
| 2009/0128653 A1* | 5/2009 | Tanaka | H04N 5/365 |
| | | | 348/222.1 |
| 2010/0053389 A1 | 3/2010 | Matsuura | |
| 2011/0019053 A1 | 1/2011 | Nishihara | |
| 2012/0256077 A1* | 10/2012 | Yen | H04N 5/37452 |
| | | | 250/208.1 |
| 2013/0009800 A1* | 1/2013 | Yang | H03F 3/45183 |
| | | | 341/155 |
| 2013/0153749 A1* | 6/2013 | Sakurai | H01L 27/14806 |
| | | | 250/208.1 |
| 2013/0162857 A1* | 6/2013 | Kwon | H04N 5/378 |
| | | | 348/222.1 |
| 2014/0009664 A1* | 1/2014 | Kinugasa | H04N 5/378 |
| | | | 348/350 |
| 2014/0293104 A1* | 10/2014 | Tanaka | H04N 5/3745 |
| | | | 348/301 |
| 2015/0281613 A1 | 10/2015 | Vogelsang et al. | |
| 2016/0295142 A1* | 10/2016 | Yoshida | H05K 999/99 |
| 2017/0064225 A1* | 3/2017 | Yamazaki | H04N 5/357 |
| 2017/0140725 A1* | 5/2017 | Saeki | G09G 3/3696 |
| 2017/0170239 A1* | 6/2017 | Lee | H01L 27/14689 |
| 2017/0272667 A1* | 9/2017 | Hynecek | H01L 27/14616 |
| 2017/0272678 A1* | 9/2017 | Sakakibara | H01L 27/14621 |
| 2017/0324920 A1 | 11/2017 | Vogelsang et al. | |

FOREIGN PATENT DOCUMENTS

| | | |
|---|---|---|
| CN | 102196201 A | 9/2011 |
| CN | 104704812 A | 6/2015 |
| CN | 106982337 A | 7/2017 |
| KR | 20070070410 A | 7/2007 |

* cited by examiner

CMOS IMAGE SENSOR, PIXEL CIRCUIT AND DRIVING METHOD THEREOF

CROSS-REFERENCE TO RELATED APPLICATION(S)

This application is a 371 National Stage application of International Application No. PCT/CN2017/107105, filed on Oct. 20, 2017, and claims priority to Chinese Application No. 201710290607.1, entitled "CMOS IMAGE SENSOR, PIXEL CIRCUIT AND DRIVING METHOD THEREOF" and filed on Apr. 27, 2017, the entire disclosures of which are incorporated herein by reference.

TECHNICAL FIELD

The present disclosure relates to the field of image collection technology, and in particular, to a CMOS image sensor, and a pixel circuit and a driving method thereof.

BACKGROUND

Image sensors may be divided into Complementary Metal Oxide Semiconductor (CMOS) image sensors and Charge Coupled Device (CCD) image sensors, and may be generally used to convert an optical signal into a corresponding electrical signal. Among them, the CMOS image sensors are widely used in digital cameras, mobile phones, medical instruments, automobiles, etc. due to their features, such as a simpler process, easier integration with other devices, a smaller size, a lighter weight, a lower power consumption, and a low cost, etc.

A pixel of a CMOS image sensor as described above is provided with a pixel circuit consisting of a plurality of transistors and one Photo Diode (PD). The plurality of transistors may be CMOS transistors or Thin Film Transistors (TFTs). Mobility of the CMOS transistor is relatively large, usually 1000 $cm^2/VS$. Therefore, the pixel circuit consisting of CMOS transistors may operate in a relatively low voltage environment. For example, for a transistor with a channel length L of 0.35 µm, an operating voltage range of the pixel circuit may be 3.3V–0V (Ground). For the TFT, when an active layer uses Low Temperature Poly-silicon (LTPS), mobility of the TFT is 300~600 $cm^2/VS$; while when amorphous silicon (a-Si) is used, the mobility of the TFT is 0.6~0.3 $cm^2/VS$. Therefore, the mobility of the TFT is much smaller than that of the CMOS transistor. In this case, when the transistor in the pixel circuit uses the TFT, the operating voltage range of the pixel circuit is larger.

SUMMARY

In an aspect of an embodiment of the present disclosure, there is provided a pixel circuit for outputting a collection signal to an image processor. The pixel circuit includes a collection circuit, a source follower circuit, and a voltage conversion circuit. The collection circuit is configured to collect incident light and convert a collected optical signal into an electric signal. The source follower circuit is configured to receive the electrical signal from the collection circuit, and is further connected to a collection signal output terminal and a scan line, and configured to output the received electrical signal to the collection signal output terminal under the control of the scan line. The voltage conversion circuit is configured to be connected to the collection signal output terminal through a read signal line, convert a voltage at the collection signal output terminal to an output voltage, and output the output voltage at a voltage output terminal, wherein the output voltage is within an operating voltage range of the image processor.

According to an embodiment of the present disclosure, the voltage conversion circuit includes a current mirror and a boost sub-circuit connected to the current mirror. The current mirror is connected to a current source, a first voltage terminal, the read signal line and the boost sub-circuit, and is configured to provide a bias current to the boost sub-circuit and to the source follower circuit through the read signal line under the control of the current source and the first voltage terminal. The boost sub-circuit is further connected to a second voltage terminal, the voltage output terminal and the read signal line, and is configured to convert the voltage of the collection signal output terminal to the output voltage through the read signal line and output the output voltage from the voltage output terminal under the control of the bias current provided by the current mirror and the second voltage terminal, wherein the output voltage is within the operating voltage range of the image processor.

According to an embodiment of the present disclosure, the boost sub-circuit includes: a first boost transistor and a second boost transistor, both being N-type transistors; wherein the first boost transistor has a gate connected to the collection signal output terminal, a drain connected to the voltage output terminal, and a source connected to the current mirror; and the second boost transistor has a gate and a drain both connected to the second voltage terminal, and a source connected to the voltage output terminal.

According to an embodiment of the present disclosure, the boost sub-circuit includes: a first boost transistor and a second boost transistor, both the first boost transistor and the second boost transistor being P-type transistors; when the boost sub-circuit is further connected to a third voltage terminal, the first boost transistor has a gate connected to the collection signal output terminal, a source connected to the voltage output terminal, and a drain connected to the current mirror; and the second boost transistor has a gate connected to the third voltage terminal, a source connected to the second voltage terminal, and a drain connected to the voltage output terminal.

According to an embodiment of the present disclosure, the current mirror includes a first common gate transistor, a second common gate transistor and a third common gate transistor, the first common gate transistor, the second common gate transistor, and the third common gate transistor being all N-type transistors; the first common gate transistor has a gate and a drain both connected to the current source, and a source connected to the first voltage terminal; the second common gate transistor has a gate connected to the current source, a drain connected to the collection signal output terminal, and a source connected to the first voltage terminal; and the third common gate transistor has a gate connected to the current source, a drain connected to the boost sub-circuit, and a source connected to the first voltage terminal.

According to an embodiment of the present disclosure, the image processor provides the current source.

According to an embodiment of the present disclosure, a CMOS image sensor provides the current source.

According to an embodiment of the present disclosure, the voltage conversion circuit includes a boost sub-circuit, and the boost sub-circuit is connected to a second voltage terminal, the voltage output terminal and the read signal line, and is configured to convert the voltage at the collection signal output terminal to the output voltage.

According to an embodiment of the present disclosure, the boost sub-circuit includes: a first boost transistor and a second boost transistor, both the first boost transistor and the second boost transistor being P-type transistors; when the boost sub-circuit is further connected to a third voltage terminal, the first boost transistor has a gate connected to the collection signal output terminal, a source connected to the voltage output terminal, and a drain connected to a first voltage terminal; and the second boost transistor has a gate connected to the third voltage terminal, a source connected to the second voltage terminal, and a drain connected to the voltage output terminal.

According to an embodiment of the present disclosure, the source follower circuit comprises a source follower transistor and a switch transistor; the source follower transistor has a gate connected to the collection circuit, a first electrode connected to a second voltage terminal, and a second electrode connected to a first electrode of the switch transistor; and the switch transistor has a gate connected to the scan line, the first electrode connected to the second electrode of the source follower transistor, and a second electrode connected to the read signal line through the collection signal output terminal, wherein the first electrode is one of the source and the drain, and the second electrode is the other of the source and the drain.

According to an embodiment of the present disclosure, the collection circuit is connected to a reset voltage terminal, a reset control signal terminal, a transmission control signal terminal, and a ground terminal; and the collection circuit includes a pass transistor, a reset transistor, a photo diode and a storage capacitor; the pass transistor has a gate connected to the transmission control signal terminal, a first electrode connected to the gate of the source follower transistor, a second electrode connected to a N-type region of the photo diode; a P-type region of the photo diode is connected to the ground terminal; the reset transistor has a gate connected to the reset control signal terminal, a first electrode connected to the reset voltage terminal, and a second electrode connected to the gate of the source follower transistor; and the storage capacitor has a first terminal connected to the gate of the source follower transistor, and a second terminal connected to the ground terminal.

In another aspect of embodiments of the present disclosure, there is provided a CMOS image sensor including any one of the pixel circuit as described above.

According to an embodiment of the present disclosure, the CMOS image sensor includes a collection area and a peripheral area disposed around the collection area; the collection area comprises a plurality of scan lines and a plurality of read signal lines which are intersected horizontally and vertically; a plurality of pixels are defined by the intersections of the scan lines and the read signal lines; wherein each pixel is provided with a collection circuit and a source follower circuit, and the source follower circuits in the same column of pixels are connected to the same read signal line through the collection signal output terminal; the voltage conversion circuits are disposed in the peripheral area, and each of the read signal lines is connected to one of the voltage conversion circuits.

In still another aspect of an embodiment of the present disclosure, there is provided a method of driving any one of the pixel circuit as described above, wherein the method includes: converting, by the collection circuit, the received optical signal into the electrical signal and outputting the electrical signal to the source follower circuit; outputting, by the source follower circuit, the received electrical signal to the collection signal output terminal under the control of the scan line; providing, by a current mirror of the voltage conversion circuit, a bias current to the source follower circuit and the boost sub-circuit under the control of the current source and the first voltage terminal; converting, by the boost sub-circuit, the voltage of the collection signal output terminal to the output voltage, and outputting the output voltage from the voltage output terminal under the control of the bias current provided by the current mirror and the second voltage terminal, wherein the output voltage is within the operating voltage range of the image processor.

BRIEF DESCRIPTION OF THE DRAWINGS

In order to explain the technical solutions in the embodiments of the present disclosure or prior art more clearly, drawings needed to be used in description of the embodiments and the prior art will be briefly described below. Obviously, the drawings in the following description merely illustrate some embodiments of the present disclosure. The skilled in the art may also obtain other drawings based on these drawings without creative effort.

DETAILED DESCRIPTION

The following describes the technical solutions in the embodiments of the present disclosure clearly and completely with reference to the accompanying drawings in the embodiments of the present disclosure. Obviously, the described embodiments are merely some but not all of the embodiments of the present disclosure. Other embodiments which may be obtained by the skilled in the art based on the embodiments of the present disclosure without creative effort shall fall within the protection scope of the present disclosure.

In the COS image sensor, in order to make the TFT have a good ON state, a larger voltage difference between a source and a drain of the TFT is required. In the related art, a negative voltage is generally used to drive one electrode of the TFT, thus an output of the pixel circuit usually outputs a negative voltage. In this case, since an operating voltage of an Integrated Circuit (IC) which receives an output signal of the pixel circuit is a positive voltage, it is required to arrange an additional interface circuit in the IC in order to enable the output voltage of the pixel circuit to match the IC. This will increase the manufacturing cost of the IC.

Figure 1:
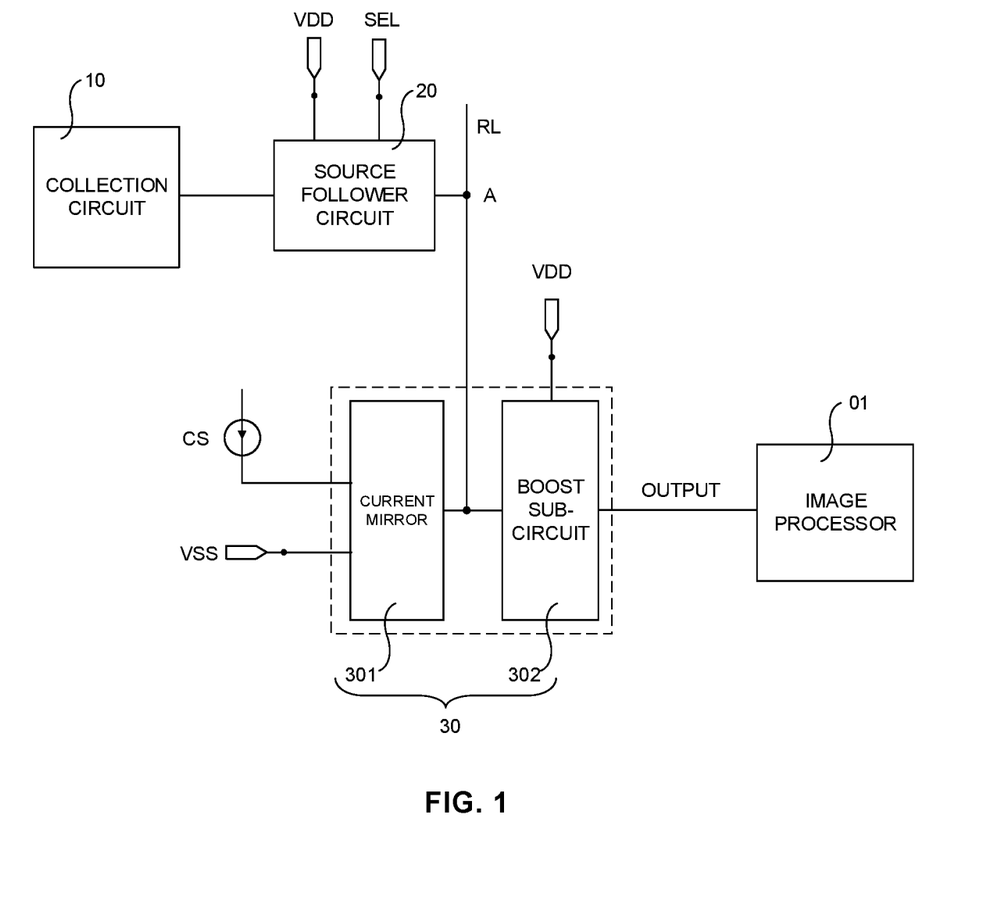
FIG. 1 is a schematic structure diagram of a pixel circuit according to an embodiment of the present disclosure.

An embodiment of the present disclosure provides a pixel circuit for outputting a collection signal to an image processor 01 as shown in FIG. 1. The image processor 01 is used to integrate collected signals of respective pixel circuits, and output image data.

According to the embodiment of the present disclosure, the pixel circuit includes a collection circuit 10, a source follower circuit 20, and a voltage conversion circuit 30.

Specifically, the collection circuit 10 is connected to the source follower circuit 20. The collection circuit 10 is configured to collect incident light, and convert the collected optical signal into an electrical signal for outputting to the source following circuit 20.

The source follower circuit 20 is also connected to a second voltage source VDD, a collection signal output terminal A, and a scan line SEL. The source follower circuit 20 is configured to amplify and buffer the received electrical signal and output it to the collection signal output terminal A under the control of the scan line SEL.

According to the embodiment of the present disclosure, the voltage conversion circuit 30 is connected to the collection signal output terminal A through a read signal line RL. The voltage conversion circuit 30 converts a voltage at the collection signal output terminal to an output voltage, and outputs the output voltage at the voltage output terminal, wherein the output voltage is within an operating voltage range of the image processor.

According to an embodiment, as shown in FIG. 1, the voltage conversion circuit 30 includes a current mirror 301 and a boost sub-circuit 302 connected to the current mirror 301.

Specifically, the current mirror 301 is connected to a current source CS, a first voltage terminal VSS, the read signal line RL, and the boost sub-circuit 302. The current mirror is configured to provide a bias current to the boost sub-circuit 302 and to the source follower circuit 20 through the read signal line RL under the control of the current source CS and the first voltage terminal VSS.

In addition, the boost sub circuit 302 is also connected to the second voltage terminal VDD, the voltage output terminal OUTPUT, and the read signal line RL. The boost sub-circuit 302 is configured to convert the voltage of the collection signal output terminal A to the output voltage Vout through the read signal line RL, and output it at the voltage output terminal OUTPUT under the control of the bias current provided by the current mirror CS and the second voltage terminal VDD. The output voltage Vout is within an operating voltage range of the image processor 01.

For example, when the operating voltage range of the image processor 01 is 0~3V, 0V<Vout<3V. At this time, the output voltage Vout matches the operating voltage of the image processor 01.

It should be noted that, the embodiment of the present disclosure is illustrated by taking the first voltage terminal VSS outputting a low level signal and the second voltage terminal VDD outputting a high level signal as an example. In addition, a value (e.g., −5V) of the output voltage of the first voltage terminal VSS is less than a minimum (e.g., 0V) of the operating voltage of the image processor 01. A value (e.g., 5V) of the output voltage of the second voltage terminal VDD is larger than a maximum (e.g., 3V) of the operating voltage of the image processor 01.

In summary, on one hand, since the current mirror 301 may provide the source follower circuit 20 with the bias current under the control of the current source CS and the first voltage terminal VSS so that a current flows through the read signal line RL, the read signal line RL may thus be connected to a negative voltage interface, i.e., the above-mentioned first voltage terminal VSS. In this way, the transistor in the pixel circuit connected to the read signal line RL through the collection signal output terminal A may be driven by the negative voltage output from the above-mentioned first voltage terminal VSS, so that there is a larger voltage difference between the source and the drain of the transistor, resulting in a good ON state.

On the other hand, since the current mirror 301 may also provide the bias current to the boost sub-circuit 302, the boost sub-circuit 302 may be in an operating state under the control of the bias current. According to the embodiment of the present disclosure, since the output voltage Vout output at the voltage output terminal OUTPUT is within the operating voltage range of the image processor 01 connected to the pixel circuit, the output voltage of the source follower circuit 20 may match the operating voltage of the image processor 01 by means of the voltage conversion circuit 30. In this way, in the boosting process as described above, the present application does not need to modify the internal structure of the image processor 01, so that the problem of increasing the manufacturing cost due to an addition of an interface circuit in the image processor 01 may be avoided. According to the embodiment of the present disclosure, for the transistor whose mobility is lower and threshold voltage Vth is higher, e.g., a TFT made by an a-Si process, the voltage conversion circuit 30 as described above is more suitable.

Hereinafter, detailed structures of respective circuits as shown in FIG. 1 will be described in detail.

Figure 2:
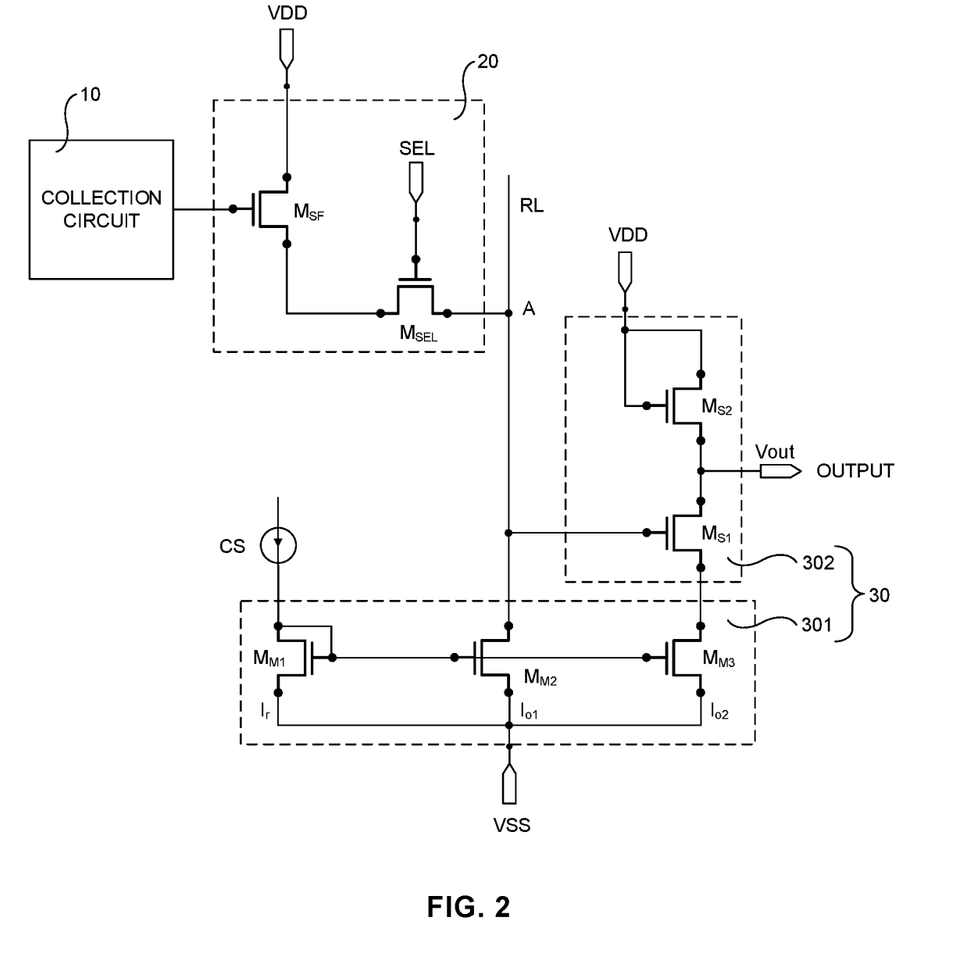
FIG. 2 is a particular schematic structure diagram of a source follower circuit and a voltage converter circuit of FIG. 1.

Specifically, as shown in FIG. 2, the boost sub-circuit 302 includes a first boost transistor $M_{S1}$ and a second boost transistor $M_{S2}$. Both the first boost transistor $M_{S1}$ and the second boost transistor $M_{S2}$ are N-type transistors.

In this case, the first boost transistor $M_{S1}$ has a gate connected to the collection signal output terminal A, a drain connected to the voltage output terminal OUTPUT, and a source connected to the current mirror 301.

The second boost transistor $M_{S2}$ has a gate and a drain both connected to the second voltage terminal VDD, and a source connected to the voltage output terminal OUTPUT.

Figure 3:
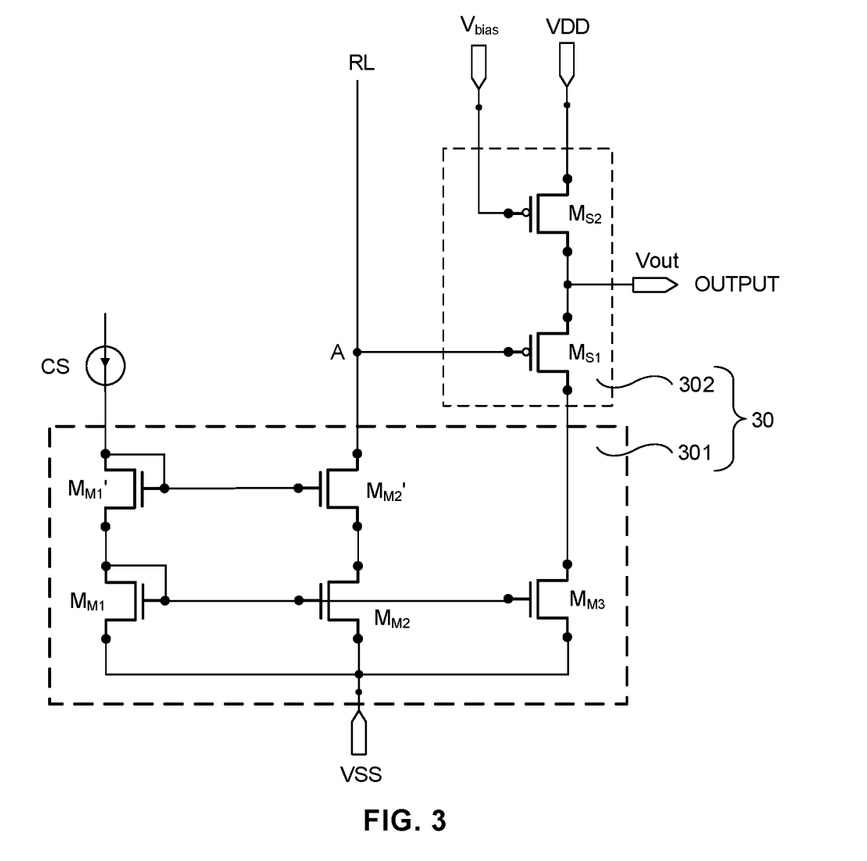
FIG. 3 is another schematic structure diagram of a voltage conversion circuit of FIG. 1.

Alternatively, the boost sub-circuit 302 includes the first boost transistor $M_{S1}$ and the second boost transistor $M_{S2}$, and both the first boost transistor $M_{S1}$ and the second boost transistor $M_{S2}$ are P-type transistors. In this case, when the boost sub-circuit 302 is further connected to a third voltage terminal Vbias as shown in FIG. 3, the first boost transistor $M_{S1}$ and the second boost transistor $M_{S2}$ are connected as follows.

The gate of the first boost transistor $M_{S1}$ is connected to the collection signal output terminal A, the source thereof is connected to the voltage output terminal OUTPUT, and the drain thereof is connected to the current mirror 301.

Additionally, the gate of the second boost transistor $M_{S2}$ is connected to the third voltage terminal Vbias, the source thereof is connected to the second voltage terminal VDD, and the drain thereof is connected to the voltage output terminal OUTPUT.

According to the embodiment of the present disclosure, as shown in FIG. 2, the current mirror 301 includes: a first common gate transistor $M_{M1}$, a second common gate transistor $M_{M2}$ and a third common gate transistor $M_{M3}$. The first common gate transistor $M_{M1}$, the second common gate transistor $M_{M2}$ and the third common gate transistor $M_{M3}$ are all N-type transistors.

Specifically, the first common gate transistor $M_{M1}$ has a gate and a drain both connected to the current source CS, and a source connected to the first voltage terminal VSS.

The second common gate transistor $M_{M2}$ has a gate connected to the current source CS, a drain connected to the collection signal output terminal A, and a source connected to the first voltage terminal VSS.

The third common gate transistor $M_{M3}$ has a gate connected to the current source CS, a drain connected to the boost sub-circuit 302, and a source connected to the first voltage terminal VSS.

In this case, a current I01 flowing through the second common gate transistor $M_{M2}$ and a current I02 flowing through the third common gate transistor $M_{M3}$ may mirror a current Ir flowing through the first common gate transistor $M_{M1}$.

The above currents satisfy the following formula:

$$I_{o1}/I_r = (W/L)_2/(W/L)_1; \qquad (1)$$

$$I_{o2}/I_r = (W/L)_3/(W/L)_1; \qquad (2)$$

where $(W/L)_1$ is an aspect ratio of the first common gate transistor $M_{M1}$; $(W/L)_2$ is an aspect ratio of the second common gate transistor $M_{M2}$; $(W/L)_3$ is an aspect ratio of the third common gate transistor $M_{M3}$. By adjusting the aspect ratios of the second common gate transistor $M_{M2}$ and the third common gate transistor $M_{M3}$, a magnitude of the mirror current may be adjusted.

In addition, in addition to adjusting the aspect ratios, it is also possible to adjust the mirror current by adding some transistors. For example, as shown in FIG. 3, the current mirror 301 may further include a transistor $M_{M1}'$ connected in series with the first common gate transistor $M_{M1}$; and may also include a transistor $M_{M2}'$ connected in series with the second common gate transistor $M_{M2}$. Here, gates of the transistors $M_{M1}'$ and $M_{M2}'$ are connected to each other.

According to the embodiment of the present disclosure, when the structure of the boost sub-circuit 302 is as shown in FIG. 2, the drain of the third common gate transistor $M_{M3}$ is connected to the source of the first boost transistor $M_{S1}$. In this case, in order to make the output voltage Vout output at the voltage output terminal OUTPUT be within the operating voltage range of the image processor 01, the voltage of the second voltage terminal VDD and the current I02 flowing through the third common gate transistor $M_{M3}$ may satisfy the following formula:

$$V\text{min} < VDD - I_{o2} \times R_{s2} < V\text{max} \qquad (3)$$

where $R_{S2}$ is an equivalent capacitance of the second boost transistor $M_{S2}$. Vmin is the minimum (e.g., 0V) of the operating voltage of the image processor 01, and Vmax is the maximum (e.g., 3V) of the operating voltage of the image processor 01.

In addition, as shown in FIG. 2, the second booster transistor $M_{S2}$ is in a Diode-connected form. At this time, the voltages of the gate and the drain of the second boost transistor $M_{S2}$ are the same. Thus, an extra gain due to non-uniformity of characteristics of the transistors in the boost sub-circuit 302 may be reduced, so that a variation of the voltage at the collection signal output terminal A may be synchronized as much as possible with a variation of the output voltage Vout at the voltage output terminal OUTPUT, thereby the effect of the aforementioned gain on the accuracy of collecting the signal by a CMOS image sensor may be reduced.

According to an embodiment, when the structure of the boost sub-circuit 302 is as shown in FIG. 3, the source of the first boost transistor $M_{S1}$ is connected to the voltage output terminal OUTPUT, and the drain thereof is connected to a drain of a third boost transistor $M_{M3}$. The first boost transistor $M_{S1}$ is a follower. A source voltage Vs of the first boost transistor $M_{S1}$ is a sum of the gate voltage Vg and a threshold voltage Vth of the first boost transistor $M_{S1}$, i.e., Vg+Vth=Vs. In this case, in order to make the output voltage Vout output at the voltage output terminal OUTPUT be within the operating voltage range of the image processor 01, the following formula may be satisfied:

$$V\text{min} < Vg + Vth < V\text{max} \qquad (4).$$

As can be seen from the above, since the first boost transistor $M_{S1}$ in FIG. 3 is a follower, the gate voltage Vg of the first boost transistor $M_{S1}$, i.e., the variation of the voltage at the collection signal output terminal A, is synchronized with the variation of the output voltage Vout output at the voltage output terminal OUTPUT, so that the effect of the gain due to the non-uniformity of the characteristics of the transistor in the boost sub-circuit 302 on the accuracy of collecting the signal by a CMOS image sensor may be avoided. Compared with the structure as shown in FIG. 2, the boost sub-circuit 302 shown in FIG. 3 has higher voltage conversion accuracy.

In the embodiment shown in FIG. 3, the current mirror 301 may be omitted as an example. At this time, the boost sub-circuit 302 is connected to the second voltage terminal, the voltage output terminal and the read signal line, and is configured to convert the voltage at the collection signal output terminal to the output voltage, as shown in formula (4) as described above.

In this example, the connection manner of the first boost transistor $M_{S1}$ and the second boost transistor $M_{S2}$ is:

the gate of the first boost transistor $M_{S1}$ being connected to the collection signal output terminal A, the source being connected to the voltage output terminal OUTPUT, and the drain being connected to the first voltage terminal VSS; and the gate of the second boost transistor $M_{S2}$ being connected to the third voltage terminal Vbias, the source thereof being connected to the second voltage terminal VDD, and the drain thereof being connected to the voltage output terminal OUTPUT.

As another example, the current mirror 301 may be connected as shown in FIG. 3. In this example, the current I02 flowing through the third common gate transistor $M_{M3}$ may finely adjust the output voltage Vout output at the voltage output terminal OUTPUT, so that the output voltage Vout output at the voltage output terminal OUTPUT is better within the operating voltage range of the image processor 01.

In summary, the output voltage Vout output at the voltage output terminal OUTPUT may be converted to be within the operating voltage range of the image processor 01 by means of the boost sub-circuit 302, thus solving the problem that the output voltage of the source follower circuit 20 does not match the operating voltage of the image processor 01 due to the read signal line RL being connected to a negative voltage interface.

According to the embodiment of the present disclosure, the above-mentioned current source CS may be provided by an external circuit separately, or may be provided by an internal circuit of a CMOS image sensor; alternatively, in order to further increase the match degree between the output voltage of the source follower circuit 20 and the operating voltage of the image processor 01, the current source CS is provided by the image processor 01.

Next, particular structures of the source follower circuit 20 and the collection circuit 10 will be described in detail.

Figure 4A:
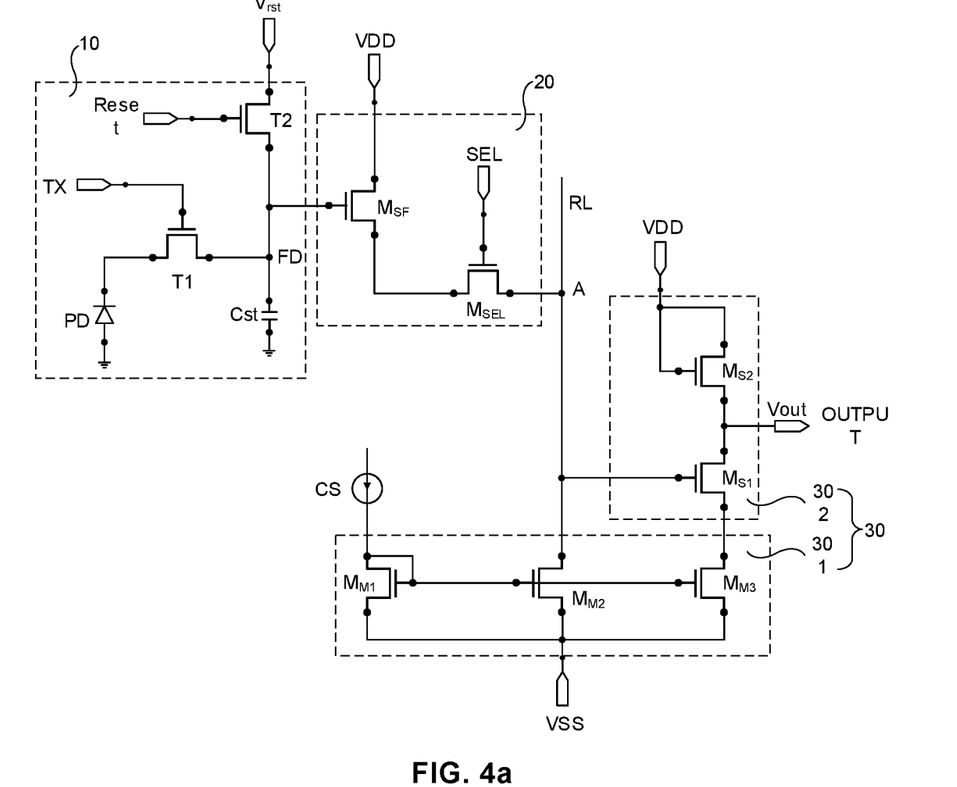
FIG. 4*a* is a schematic structure diagram of a collection circuit of FIG. 1.

Specifically, as shown in FIG. 2 or FIG. 4a, the source follower circuit 20 includes a source follower transistor $M_{SF}$ and a switch transistor $M_{SEL}$.

The source follower transistor $M_{SF}$ has a gate connected to the collection circuit 10, a first electrode connected to the second voltage terminal VDD, and a second electrode connected to a first electrode of the switch transistor $M_{SEL}$.

The switch transistor $M_{SEL}$ has a gate connected to the scan line SEL, the first electrode connected to the second electrode of the source follower transistor, and a second electrode connected to the read signal line RL through the collection signal output terminal A.

According to the embodiment of the present disclosure, when the collection circuit 10 is connected to a reset voltage terminal $V_{rst}$, a reset control signal terminal Reset, a transmission control signal terminal TX, and a ground terminal, the collection circuit 10 includes a pass transistor T1, a reset transistor T2, a photo diode (PD), and a storage capacitor Cst, as shown in FIG. 4a.

The pass transistor T1 has a gate connected to the transmission control signal terminal TX, a first electrode connected to the gate of the source follower transistor $M_{SF}$, and a second electrode connected to an N-type region of the photo diode PD. A P-type region of the photo diode PD is connected to the ground terminal.

The reset transistor T2 has a gate connected to the reset control signal terminal Reset, a first electrode connected to the reset voltage terminal $V_{rst}$, and a second electrode connected to the gate of the source follower transistor $M_{SF}$.

A first terminal of the storage capacitor Cst is connected to the gate of the source follower transistor $M_{SF}$, and a second terminal is connected to the ground terminal.

According to the embodiment of the present disclosure, a driving process of the collection circuit 10 and the source follower circuit 20 as mentioned above is particularly described as follows.

Figure 4B:
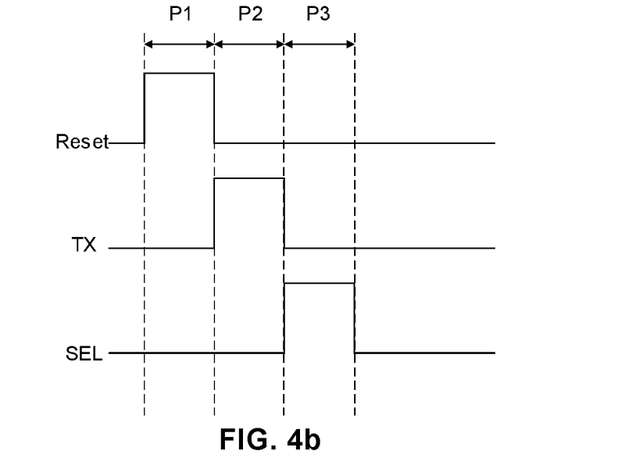
FIG. 4*b* is a timing sequence for controlling the circuit structure as shown in FIG. 4*a;*

As shown in FIG. 4b, in a first phase P1, the reset control signal terminal Reset outputs a high level signal, controlling the reset transistor T2 to be turned on to output the voltage of the reset voltage terminal $V_{rst}$ to the gate of the source follower transistor $M_{SF}$, thereby resetting the gate voltage of the source follower transistor $M_{SF}$ and releasing charges stored in the storage capacitor Cst. This may prevent the charges of the previous image frame which remain in the gate of the source follower transistor $M_{SF}$ and the storage capacitor Cst from affecting the collection voltage of the present image frame.

Next, in a second phase P2, the transmission control signal terminal TX outputs a high level signal to turn on the pass transistor T1 under the control of the transmission control signal terminal TX, so as to enable the photo diode PD to receive the incident light and perform photoelectric conversion under illumination of the light to generate photo-generated carriers. The photo-generated carriers are transferred from the photo diode PD to a floating diffusion (FD) region.

Next, in a third phase P3, the source follower transistor $M_{SF}$ is turned on under the control of the floating diffusion region. In addition, the scan line SEL outputs a high level signal, so that the switch transistor $M_{SEL}$ is also turned on under the control of the scan line SEL, enabling the above photo-generated carriers to be output from the floating diffusion region to the collection signal output terminal A and the read signal line RL connected to the collection signal output terminal A via the source follower transistor $M_{SF}$ having the amplification and buffering functions and via the switch transistor $M_{SEL}$ sequentially. As such, one optical signal collection and output process is completed.

According to the embodiment of the present disclosure, the current source CS is activated to turn on the voltage conversion circuit 30 as described above. As known from the above, the voltage output from the read signal line RL is converted to be within the operating voltage range of the image processor 01 by the voltage conversion circuit 30 receiving the voltage, achieving the purpose that the voltage output from the read signal line RL matches the operating voltage of the image processor 01.

It should be noted that the above collection circuit 10 includes the pass transistor T1 and the reset transistor T2. The source follower circuit 20 includes a source follower transistor $M_{SF}$ and the switch transistor $M_{SEL}$. Therefore, the collection circuit 10 and the source follower circuit 20 include a total of 4 transistors, thereby constituting a 4T-Active Pixel Sensor (4T-APS). Alternatively, the above-mentioned collection circuit 10 may also include only one transistor, i.e., the above-mentioned reset transistor T2, and the N-type region of the photo diode PD is directly connected to the floating diffusion region. In this way, the collection circuit 10 and the source follower circuit 20 may constitute a 3T-APS. In this case, the second phase P2 may be omitted in FIG. 4b.

In addition, the present disclosure may perform directly image processing on the signal firstly collected by the above APS in the image processor 01, after the signal being subjected to the voltage conversion in the voltage conversion circuit 30. Alternatively, after the signal firstly collected by the APS is subjected to the voltage conversion in the voltage conversion circuit 30, it may be used as a reference value in the image processor 01. The subsequently collected signals may be compared with the reference value one by one, and then the image processing may be performed on the compared values.

An embodiment of the present disclosure provides a CMOS image sensor including any one of the pixel circuit as described above. It has the same beneficial effects as those of the CMOS image sensor provided in the foregoing embodiments, and thus description thereof are omitted here.

Figure 5:
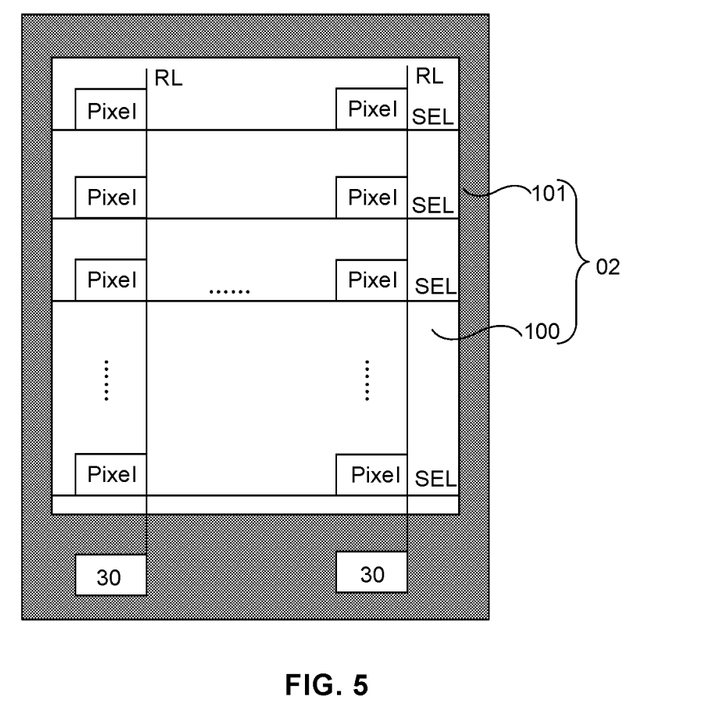
FIG. 5 is a schematic structure diagram of a CMOS image sensor according to an embodiment of the present disclosure.

In addition, as shown in FIG. 5, the CMOS image sensor 02 includes a collection area 100 and a peripheral area 101 disposed around the collection area 100.

The collection area 100 includes a plurality of scan lines SEL and a plurality of read signal lines RL which are intersected horizontally and vertically. A plurality of pixels is defined by the intersections of the scan lines and the read signal lines. Each of the pixels is provided with the collection circuit 10 and the source follower circuit 20 as shown in FIG. 1. The source follower circuits 20 in the same column of pixels are connected to the same read signal line RL through the collection signal output terminal A.

According to the embodiment of the present disclosure, as the collection accuracy of the CMOS image sensor is improved, the resolution is also increased, so that the wiring area of the pixel is gradually reduced. In order to meet the demand of high resolution, the voltage conversion circuit 30 is disposed in the peripheral area 101, and each read signal line RL is connected to the voltage conversion circuit 30. Since the collection circuit 10 and the source follower circuit 20 in each pixel are turned on row by row, the voltage conversion circuit 30 may perform voltage conversion row by row on the collection voltage output from the source follower circuit 20 through the read signal line RL, so that the output voltage of the source follower circuit 20 in each row of pixels may match the operating voltage of the image processor 01.

Figure 6:
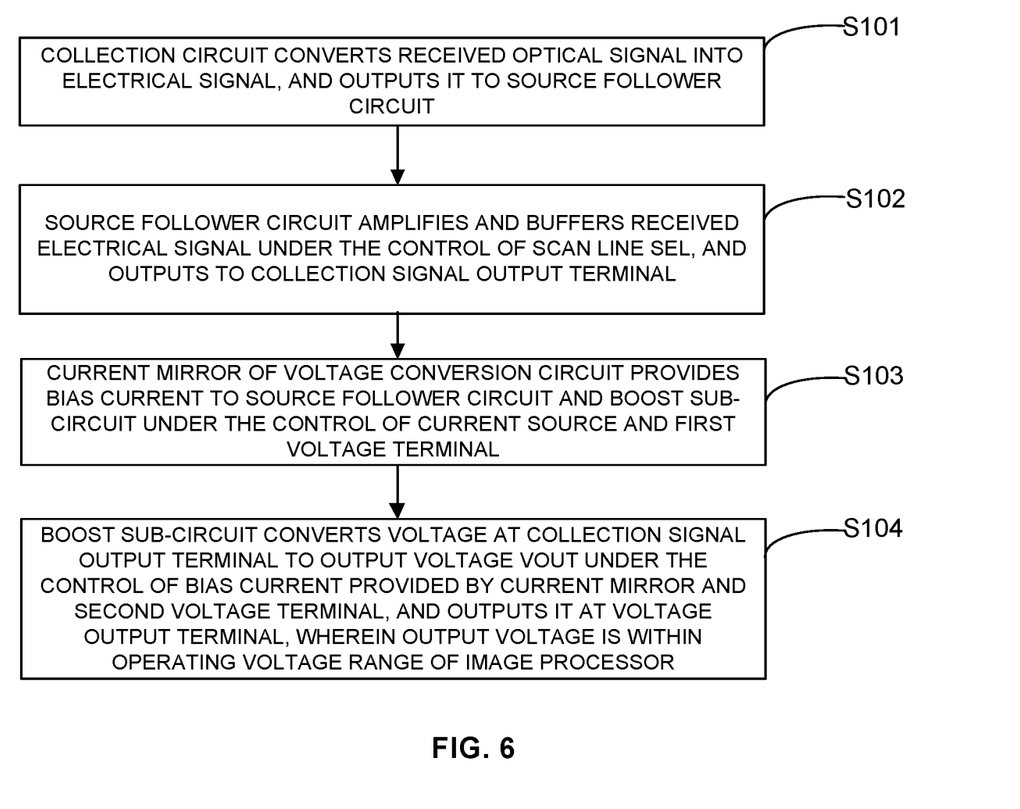
FIG. 6 is a flowchart of a driving method of a pixel circuit according to an embodiment of the present disclosure.

An embodiment of the present disclosure provides a method of driving any one of the pixel circuit as described above. As shown in FIG. 6, the method includes:

S101, in which the collection circuit 10 as shown in FIG. 1 converts the received optical signal into an electrical signal, and outputs it to the source follower circuit 20;

S102, in which the source follower circuit 20 amplifies and buffers the received electrical signal under the control of the scan line SEL, and outputs it to the collection signal output terminal A, wherein when the structures of the collection circuit 10 and the source follower circuit 20 as described above are as shown in FIG. 4a, the driving process of the collection circuit 10 and the source follower circuit 20 is the same as described above, and description of which will not be described here;

S103, in which the current mirror 301 of the voltage conversion circuit 30 provides a bias current to the source follower circuit 20 and the boost sub-circuit 302 under the control of the current source CS and the first voltage terminal VSS, wherein when the structure of the current mirror 301 is as shown in FIG. 2, 3, or 4, the process of providing the bias current to the current mirror CS is as described above, and description of which will not be described here; and S104, in which the boost sub-circuit 302 converts the voltage at the collection signal output terminal A to the output voltage Vout under the control of the bias current provided by the current mirror 301 and the second voltage terminal VDD, and outputs it at the voltage output terminal OUTPUT, wherein the output voltage Vout is within the operating voltage range of the image processor 01.

Specifically, when the structure of the boost sub-circuit 302 is as shown in FIG. 2 or FIG. 3, the boosting process of the boost sub-circuit 302 is as described above, and description of which will not be described here.

The method of driving the pixel circuit as described above has the same beneficial effects as those of the pixel circuit provided in the foregoing embodiments, and description of which will not be described here.

The foregoing descriptions are merely particular implementations of the present disclosure, but the scope of protection of the present disclosure is not limited thereto. Any changes or replacements that can be easily conceived by the skilled in the art within the technical scope disclosed by the present disclosure should be fall within the scope of the present disclosure. Therefore, the protection scope of the present disclosure should be based on the protection scope of the appended claims.

We claim:

1. A pixel circuit for outputting a collection signal to an image processor, the pixel circuit comprising:
    a collection circuit, configured to collect an incident light and convert a collected optical signal into an electrical signal;
    a source follower circuit, configured to receive the electrical signal from the collection circuit, the source follower circuit being further connected to a collection signal output terminal and a scan line, and configured to output the received electrical signal to the collection signal output terminal under the control of the scan line; and
    a voltage conversion circuit, configured to be connected to the collection signal output terminal through a read signal line, convert a voltage at the collection signal output terminal to an output voltage, and output the output voltage at a voltage output terminal, wherein the output voltage is within an operating voltage range of the image processor,
    wherein the voltage conversion circuit comprises a current mirror and a boost sub-circuit connected to the current mirror,
    the current mirror comprises: a first common gate transistor, a second common gate transistor and a third common gate transistor, the first common gate transistor, the second common gate transistor, and the third common gate transistor being all N-type transistors;
    a gate and a drain of the first common gate transistor are connected to the current source, and a source of the first common gate transistor is connected to the first voltage terminal;
    a gate of the second common gate transistor is connected to the current source, a drain of the second common gate transistor is connected to the collection signal output terminal, and a source of the second common gate transistor is connected to the first voltage terminal; and
    a gate of the third common gate transistor is connected to the current source, a drain of the third common gate transistor is connected to the boost sub-circuit, and a source is connected to the first voltage terminal,
    the current mirror is configured to provide a bias current to the boost sub-circuit and to the source follower circuit through the read signal line under the control of the current source and the first voltage terminal.

2. The pixel circuit according to claim 1, wherein the boost sub-circuit is further connected to a second voltage terminal, the voltage output terminal and the read signal line, and is configured to convert the voltage of the collection signal output terminal to the output voltage through the read signal line and output the output voltage from the voltage output terminal under the control of the bias current provided by the current mirror and the second voltage terminal, wherein the output voltage is within the operating voltage range of the image processor.

3. The pixel circuit according to claim 2, wherein the boost sub-circuit comprises: a first boost transistor and a second boost transistor, both the first boost transistor and the second boost transistor being N-type transistors;
    a gate of the first boost transistor is connected to the collection signal output terminal, a drain of the first boost transistor is connected to the voltage output terminal, and a source of the first boost transistor is connected to the current mirror; and
    a gate and a drain of the second boost transistor are connected to the second voltage terminal, and a source of the second boost transistor is connected to the voltage output terminal.

4. The pixel circuit according to claim 2, wherein the boost sub-circuit comprises: a first boost transistor and a second boost transistor, both the first boost transistor and the second boost transistor being P-type transistors;
    when the boost sub-circuit is further connected to a third voltage terminal, a gate of the first boost transistor is connected to the collection signal output terminal, a source of the first boost transistor is connected to the voltage output terminal, and a drain of the first boost transistor is connected to the current mirror; and
    a gate of the second boost transistor is connected to the third voltage terminal, a source of the second boost transistor is connected to the second voltage terminal, and a drain of the second boost transistor is connected to the voltage output terminal.

5. A pixel circuit according to claim 2, wherein the image processor provides the current source.

6. The pixel circuit according to claim 2, wherein the CMOS image sensor provides the current source.

7. The pixel circuit according to claim 1, wherein the source follower circuit comprises a source follower transistor and a switch transistor;
   a gate of the source follower transistor is connected to the collection circuit, a first electrode of the source follower transistor is connected to a second voltage terminal, and a second electrode of the source follower transistor is connected to a first electrode of the switch transistor; and
   a gate of the switch transistor is connected to the scan line, a second electrode of the switch transistor is connected to the read signal line through the collection signal output terminal,
   wherein the first electrode is one of the source and the drain, and the second electrode is the other of the source and the drain.

8. The pixel circuit according to claim 7, wherein the collection circuit is connected to a reset voltage terminal, a reset control signal terminal, a transmission control signal terminal, and a ground terminal; and the collection circuit comprises a pass transistor, a reset transistor, a photo diode and a storage capacitor;
   a gate of the pass transistor is connected to the transmission control signal terminal, a first electrode of the pass transistor is connected to the gate of the source follower transistor, a second electrode of the pass transistor is connected to a N-type region of the photo diode;
   a P-type region of the photo diode is connected to the ground terminal;
   a gate of the reset transistor is connected to the reset control signal terminal, a first electrode of the reset transistor is connected to the reset voltage terminal, and a second electrode of the reset transistor is connected to the gate of the source follower transistor; and
   a first terminal of the storage capacitor is connected to the gate of the source follower transistor, and a second terminal of the storage capacitor is connected to the ground terminal.

9. A CMOS image sensor, comprising the pixel circuit according to claim 1.

10. The CMOS image sensor according to claim 9, wherein the CMOS image sensor comprises a collection area and a peripheral area disposed around the collection area;
   the collection area comprises a plurality of scan lines and a plurality of read signal lines which are intersected horizontally and vertically; and a plurality of pixels are defined by the intersections of the scan lines and the read signal lines;
   wherein each pixel is provided with a collection circuit and a source follower circuit, and the source follower circuits in the same column of pixels are connected to the same read signal line through the collection signal output terminal; and
   the voltage conversion circuits are disposed in the peripheral area, and each of the read signal lines is connected to one of the voltage conversion circuits.

11. A method of driving the pixel circuit according to claim 1, wherein the method comprises:
   converting, by the collection circuit, the received optical signal into the electrical signal and outputting the electrical signal to the source follower circuit;
   outputting, by the source follower circuit, the received electrical signal to the collection signal output terminal under the control of the scan line;
   providing, by a current mirror of the voltage conversion circuit, a bias current to the source follower circuit and the boost sub-circuit under the control of the current source and the first voltage terminal; and
   converting, by the boost sub-circuit, the voltage of the collection signal output terminal to the output voltage, and outputting the output voltage from the voltage output terminal under the control of the bias current provided by the current mirror and the second voltage terminal, wherein the output voltage is within the operating voltage range of the image processor.

12. The pixel circuit according to claim 2, wherein the source follower circuit comprises a source follower transistor and a switch transistor;
   a gate of the source follower transistor is connected to the collection circuit, a first electrode of the source follower transistor is connected to a second voltage terminal, and a second electrode of the source follower transistor is connected to a first electrode of the switch transistor; and
   a gate of the switch transistor is connected to the scan line, a second electrode of the switch transistor is connected to the read signal line through the collection signal output terminal,
   wherein the first electrode is one of the source and the drain, and the second electrode is the other of the source and the drain.

13. The CMOS image sensor according to claim 9, wherein
   the boost sub-circuit is further connected to a second voltage terminal, the voltage output terminal and the read signal line, and is configured to convert the voltage of the collection signal output terminal to the output voltage through the read signal line and output the output voltage from the voltage output terminal under the control of the bias current provided by the current mirror and the second voltage terminal, wherein the output voltage is within the operating voltage range of the image processor.

14. The CMOS image sensor according to claim 13, wherein the boost sub-circuit comprises: a first boost transistor and a second boost transistor, both the first boost transistor and the second boost transistor being N-type transistors;
   a gate of the first boost transistor is connected to the collection signal output terminal, a drain of the first boost transistor is connected to the voltage output terminal, and a source of the first boost transistor is connected to the current mirror; and
   a gate and a drain of the second boost transistor are connected to the second voltage terminal, and a source of the second boost transistor is connected to the voltage output terminal.

15. The CMOS image sensor according to claim 13, wherein the boost sub-circuit comprises: a first boost transistor and a second boost transistor, both the first boost transistor and the second boost transistor being P-type transistors;
   when the boost sub-circuit is further connected to a third voltage terminal, a gate of the first boost transistor is connected to the collection signal output terminal, a source of the first boost transistor is connected to the voltage output terminal, and a drain of the first boost transistor is connected to the current mirror; and
   a gate of the second boost transistor is connected to the third voltage terminal, a source of the second boost transistor is connected to the second voltage terminal, and a drain of the second boost transistor is connected to the voltage output terminal.

* * * * *